United States Patent

Tolar

[15] 3,689,993

[45] Sept. 12, 1972

[54] FABRICATION OF SEMICONDUCTOR DEVICES HAVING LOW THERMAL INPEDANCE BONDS TO HEAT SINKS

[72] Inventor: Neal Jay Tolar, Richardson, Tex.

[73] Assignee: Texas Instruments Incorporated, Dallas, Tex.

[22] Filed: July 26, 1971

[21] Appl. No.: 166,285

Related U.S. Application Data

[62] Division of Ser. No. 855,639, Sept. 5, 1969, abandoned.

[52] U.S. Cl. ....................29/583, 29/580, 317/234 A

[51] Int. Cl. ............................B01j 17/00, H01l 7/66

[58] Field of Search................29/576, 580, 583, 591; 317/234 A, 235 AK

[56] References Cited

UNITED STATES PATENTS

| | | | |
|---|---|---|---|
| 2,530,110 | 11/1950 | Woodyard | 29/576 X |
| 3,061,422 | 10/1962 | Sats | 317/235 AK |
| 3,319,135 | 5/1967 | Cunningham | 317/235 AK |
| 3,508,124 | 4/1970 | Boule et al. | 29/589 X |
| 3,618,202 | 11/1971 | Callahan et al. | 29/580 |

FOREIGN PATENTS OR APPLICATIONS

| | | | |
|---|---|---|---|
| 1,004,422 | 9/1965 | Great Britain | 317/235 |

OTHER PUBLICATIONS

IBM Technical Disclosure Bulletin Vol. 14, No. 1, June 1971, page 295–296. Article by S. Oktay et al.
Electronics, February 17, 1969 pages 64–65.

*Primary Examiner*—John F. Campbell
*Assistant Examiner*—Richard Bernard Lazarus
*Attorney*—Melvin Sharp et al.

[57] ABSTRACT

A layer of contact metallization is applied over the surface of a semiconductor slice having a P-N junction. A heat sink layer of high conductivity metal, such as copper, is applied over the contact metallization with a sufficient thickness to provide a predetermined heat dissipation for the P-N junction. A plurality of spaced apart discrete metal contacts are formed over the opposite surface of the semiconductor slice. Portions of the semiconductor slice are then removed between the metal contacts in order to form an array of discrete semiconductor devices, such as avalanche diodes, extending from the heat sink layer. The heat sink layer is then divided to provide a plurality of semiconductor devices attached to individual low thermal impedance heat sink members.

21 Claims, 10 Drawing Figures

FABRICATION OF SEMICONDUCTOR DEVICES HAVING LOW THERMAL INPEDANCE BONDS TO HEAT SINKS

This application is a division of application Ser. No. 855,639 filed Sept. 5, 1969, now abandoned.

This invention relates to semiconductor articles and techniques for fabrication thereof, and more particularly to active semiconductor device arrays having a low thermal impedance bond to a heat sink and techniques for fabricating the same.

The performance of a large number of semiconductor devices is dependent upon adequate heat removal, and heat sinks are thus widely used. For instance, transistors, semiconductor power devices, and diodes such as varacter diodes often have sufficient temperature problems that the devices must be bonded to a heat sink in a package or circuit.

In particular, semiconductor avalanche diodes which have potential wide use in microwave oscillator circuits, have been subject to severe heat sink problems. Heretofore, semiconductor avalanche diodes have been fabricated from silicon chips and then individually bonded at their junction side to a heat sink. Because of the high frequencies involved with such microwave oscillators, and due to the capacitance per unit area of the diode junctions, the semiconductor chips comprising the avalanche diodes are normally quite small and on the order of 4 to 10 mils in diameter. The diodes must also have a thickness in the range of 2 to 3 mils, in order to provide accurate chemical etching of the devices from a semiconductor slice. Such previously developed avalanche diodes have generally been individually fabricated, and thus the thermal characteristics of the diodes has been found to substantially vary from diode to diode.

Relatively high power densities are required for efficient diode operation in such microwave oscillators, with typical densities being $10^5$ watts/cm$^2$ and higher. It is thus desirable that the avalanche diodes used therein be bonded to a high conductivity heat sink with as small as possible thermal impedance in the bond itself. The thermal impedance of the bonded avalanche diodes, in terms of degrees centigrade per watt input power will, of course, be limited by the area of the diode and by the thermal conductivity of the heat sink material. As an example, a typical thermal impedance of a 6 mil diameter silicon avalanche diode bonded to a copper heat sink would include approximately a 10° C/watt contribution from the copper heat sink, and 4° C/watt from the thin layer of silicon comprising the avalanche diode. Although it would be extremely desirable for this 14° C/watt to be the entire thermal impedance of the heat sunk diode, in practice the bond between the diode and the copper heat sink has not consistently approached theoretical thermal impedance limits.

Bonding between such active semiconductor devices as avalanche diodes has generally been thermal compression in nature, and has often been subject to difficulties in obtaining a void-free contact. Such prior bonding techniques have often required extremely smooth polished bonding surfaces which are expensive and difficult to obtain. Even with highly polished bonding surfaces, the prior art bonding techniques for semiconductor devices and heat sinks have generally produced low yields due to problems in handling individual semiconductor chips. Additionally, problems have occurred in obtaining good ohmic contact bonds for avalanche diodes, due to the requirement that low temperature organic adhesive material is often required for mounting the extremely thin semiconductor slice during each processes as evaporating and etching. Such low temperature organic adhesives have been found in some instances to degradate ohmic bonds during the time of evaporation.

In accordance with the present invention, a layer of heat sink material is applied to one surface of a semiconductor substrate. Portions of the semiconductor substrates are removed to form an array of spaced apart discrete semiconductor devices which extend from the layer of heat sink material. The layer of heat sink material is then divided to form a plurality of separate semiconductor devices attached to respective heat sink members.

In accordance with a more specific aspect of the invention, a layer of contact material is formed over one surface of a semiconductor body having a P-N junction. A layer of high conductivity heat sink material is formed over the contact material, the layer of heat sink material having a thickness sufficient to provide a selected heat dissipation for the P-N junction. A plurality of discrete spaced apart contacts are formed over a surface of the semiconductor body opposite the surface bonded to the layer of heat sink material. Portions of the semiconductor body are removed between the spaced apart contacts in order to form an array of discrete active semiconductor devices which extend from the heat sink material. The heat sink material may then be separated to form a plurality of separate heat sinked semiconductor devices.

In accordance with another specific aspect of the invention, avalanche diodes may be fabricated with attached heat sinks by forming a semiconductor slice having a P-N junction. A layer of contact metallization is then applied over the surface of the slice which is nearest the P-N junction. A layer of high conductivity metal is applied over the contact metallization, the high conductivity metal having a sufficient thickness to provide heat dissipation for the P-N junction. A plurality of spaced apart metal contacts are formed over the opposite surface of the slice from the layer of high conductivity metal. Portions of the semiconductor slice are then removed between the metal contacts in order to form an array of discrete avalanche diodes which extend from the layer of high conductivity metal. The layer of high conductivity metal is divided to provide a plurality of avalanche diodes attached to individual heat sink members.

In accordance with other aspects of the invention, avalanche diode arrays are formed which include a unitary high conductivity heat sink member having at least one flat metallized contact surface. A plurality of spaced apart discrete diodes are bonded to and extend from the contact surface, each diode including a P-N junction capable of operating in the avalanche mode. Each of the discrete diodes have closely similar thermal resistance characteristics.

For a more complete understanding of the present invention and for further objects and advantages thereof, reference is now made to the following description taken in conjunction with the accompanying drawings, in which.

Figure 1:
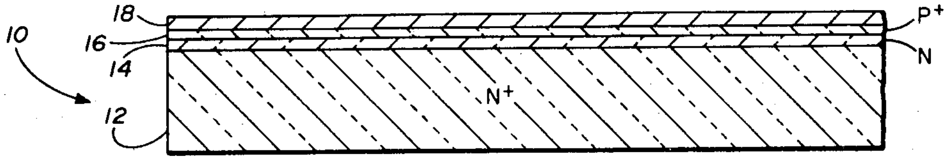
FIG. 1 illustrates a sectional view of a three-layer semiconductor slice including an upper layer of metallization.
Figure 2:
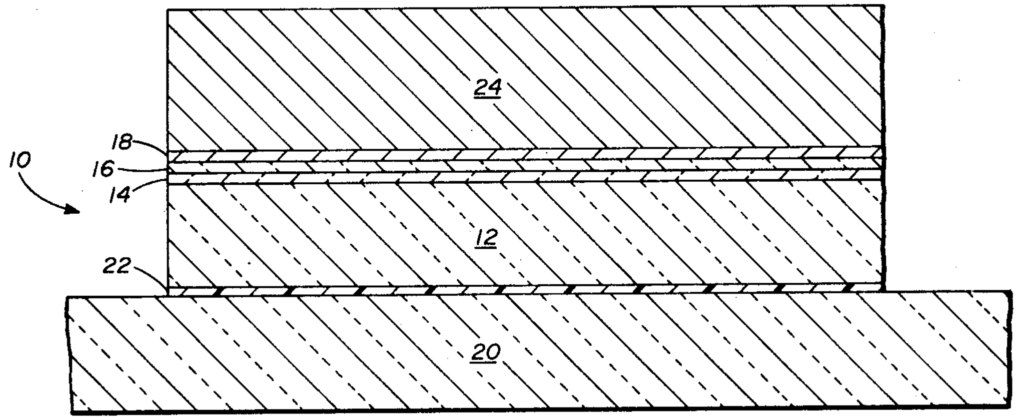
FIG. 2 illustrates the semiconductor structure in FIG. 1 attached to a support surface and including a thick layer of high conductivity metal plated thereon.
Figure 3:
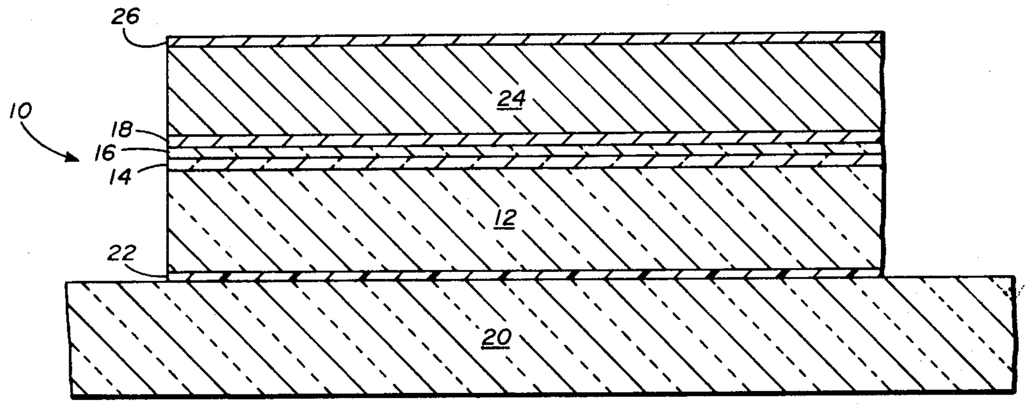
FIG. 3 illustrates the structure of FIG. 2 after the layer of high conductivity metal is reduced in thickness and has a metallization layer applied thereto.

Referring to FIG. 1, a metallized semiconductor slice is illustrated generally by the numeral 10 and comprises the initial structure in the fabrication of an array of avalanche diodes according to the invention. The invention is applicable to a number of semiconductor devices, such as transistors, power transistors, diodes and the like, but will be explained in terms of avalanche diodes as the preferred embodiment thereof. The semiconductor slice 10 in this instance includes a layer 12 comprised of N+ type semiconductor material and which supports a thinner layer 14 of N type material. A layer 16 of P+ type material is disposed over layer 14. A metallization layer 18 is deposited over the layer 16.

It will be understood that the relative thicknesses of semiconductor layers 14 and 16 and the metallization layer 18 have been exaggerated for case of illustration. While the relative thickness of the semiconductor slice used with the invention may vary according to desired operating characteristics, the slice 10 will typically have a diameter of from 1 to 2 inches, and a thickness of between 8 to 12 mils. The P+ type layer 16 and the N type layer 14 will generally comprise less than 0.5 mil of the overall thickness. The three-layer semiconductor slice 10 may be fabricated by any known conventional method, such as by epitaxial or diffusion techniques. While a three-layer semiconductor slice 10 has been illustrated to form a P-N junction, it will be understood that other types of P-N junctions may be utilized with the invention, such as a Schottky barrier semiconductor junction.

The metallization layer 18 may comprise any suitable conventional type of contact layer, but preferably comprises a multimetal contact layer. For instance, a contact layer which works well in practice comprises a first layer of titanium deposited by any suitable technique, such as evaporation over the P+ type semiconductor layer 16. An intermediate layer of tungsten is then deposited over the titanium layer, and an upper layer of gold is deposited over the tungsten layer. The titanium layer provides excellent ohmic contact with the semiconductor layer. The tungsten layer provides a barrier to prevent the gold layer from getting to the semiconductor slice and alloying therewith. Gold is particularly advantageous for the upper layer because of its noble nature and because of its excellent conductivity characteristics. In practice, a layer of titanium of approximately 5 millionths of an inch, along with a layer of tungsten of a thickness of about 10 millionths of an inch is applied. A typical layer of gold will have a thickness of approximately 20 millionths of an inch.

After completion of the metallized slice 10 shown in FIG. 1, the slice 10 is mounted to a suitable support glass disc 20 by means of a thin layer of adhesive 22. Any suitable adhesive having a low temperature melting point may be utilized, with wax or epoxy working well in practice. Once attached to the glass disc 20, the metallized slice 10 is subjected to plating techniques and a thick layer of high conductivity metal 24 is plated over the metallization layer 18. Metal layer 24 will serve as the heat sink for the diode array to be later formed, and may comprise any suitable type of heat sink material. In practice, copper or silver has been advantageously used to form the high conductivity metal layer 24. In the particular embodiment being described, a layer of high conductivity metal 24 was provided with a thickness of about 10 to 20 mils. Metal layer 24 may be formed over the metal slice 10 by any suitable technique, with the preferred techniques comprising conventional electroforming, wherein the slice 10 and the glass support disc 20 are placed in a solution of copper sulfate and a voltage applied across the slice and an adjacent copper anode. The required thickness of copper is then evenly plated over the metallization layer 18.

After the plating operations, the high conductivity metal layer 24 is mechanically machined to reduce the thickness thereof to a predetermined width adequate to provide proper heat sinking for the diodes to be subsequently fabricated. The final thickness of the metal layer 24 in this particular embodiment will be about 10 to 15 mils. Conventional surface grinders or milling machines may be used to reduce the thickness of the metal layer 24 to provide a smooth finish thereto. The smooth upper surface of the metal layer 24 is then plated with a contact metallization layer 26, such as a gold layer having a thickness of between 0.2 and 1 mil. The metallization layer 26 facilitates soldering or bonding of the heat sink in subsequent packaging and also serves as an inert protection for the high conductivity metal layer 24 during subsequent processing.

Figure 4:
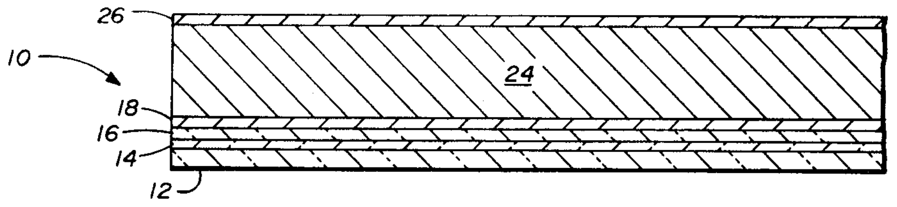
FIG. 4 illustrates the structure of FIG. 3 after removal from the support structure and after the thickness of the semiconductor slice has been reduced.

As shown in FIG. 4, the glass disc 20 is removed by dissolving adhesive layer 22. The semiconductor N+ type layer 12 is then reduced in thickness to about 3.7 mils so that the semiconductor slice 10 has an overall thickness of approximately 4 mils. The reduction of thickness of the semiconductor layer 12 may be accomplished with a conventional lapping machine or by hand lapping with abrasives. After the lapping down of the thickness of the semiconductor layer 12, layer 12 is subjected to chemical etching down to a thickness of 1 to 2 mils. The chemical etching provides an extremely accurate thickness for layer 12, as well as providing a smooth surface for subsequent processing. It should be understood at this point that slice 10 could have been previously thinned by suitable techniques to the desired thickness before the application of the high conductivity metal layer 24 as previously described. In this instance, of course, the thinning of the slice 10 in the manner shown in FIG. 4 is not required.

Figure 5:
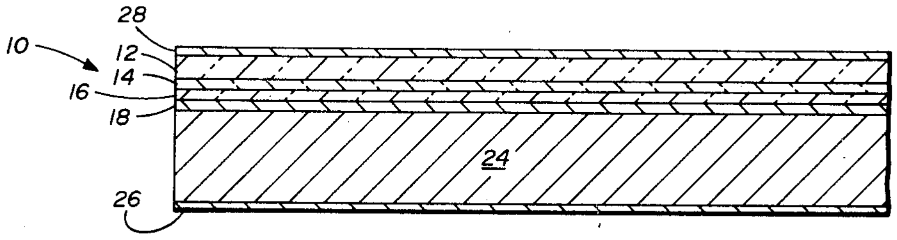
FIG. 5 illustrates a sectional view of the structure shown in FIG. 4 in an upended position and including a layer of metallization disposed over the backside of the semiconductor slice.

Referring to FIG. 5, the slice 10 is now flipped over from the position shown in FIG. 4 and a contact metallization layer 28 applied by conventional evaporation methods. Metallization layer 28 may again comprise any suitable conventional metallization, but preferably will comprise a multimetal contact similar to the metallization layer 18 previously described. Thus, a first layer of titanium is applied, with an intermediate layer of tungsten deposited before application of the upper layer of gold.

It is important to note at this step of the process the advantages arising from the present invention due to the fact that no organic adhesive is required for support of the slice 10 for subsequent processing. In previous avalanche diode fabrication techniques, such organic adhesives were often required in order to apply multimetal contacts, thus preventing optimum metallization from being applied within a vacuum system. In fact, in previous fabrication techniques for avalanche diodes, it was difficult to utilize an intermediate layer of tungsten when such organic adhesives were present, as the tungsten requires higher temperatures for application than the organic adhesives could withstand. With the present invention, no such organic adhesive is necessary at this point, and thus the intermediate layer of tungsten may be advantageously applied.

Figure 6:
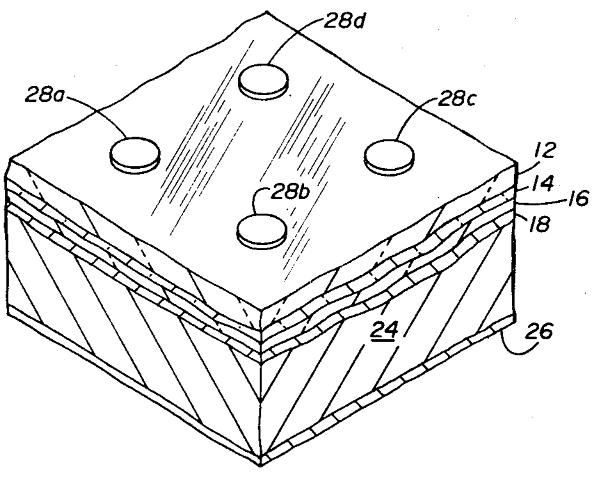
FIG. 6 illustrates a perspective view of a portion of the structure shown in FIG. 5 with four metal contacts defined thereon.

FIG. 6 illustrates a perspective view of a portion of the semiconductor slice 10, after the completion of the next fabrication step of etching away portions of the metal layer 28 to form metal terminals 28*a–d*. These metal contacts are formed by standard photolithographic and etching techniques, which will thus not be described in detail. Basically, of course, such techniques comprise the application of photoresist material which is developed through a suitable mask and the application of etching acids. While the shape of the contacts 28*a–d* are illustrated as being circular, it will be understood that other shapes will be suitable for other applications. For instance, an elongated oval shape contact, as will be later described, is suitable for many applications. While only a portion of the semiconductor slice 10 has been illustrated in FIG. 6, in the actual practice of the invention, anywhere from one hundred to several thousand contacts will be defined, each having a diameter of 4 to 10 mils.

Figure 7:
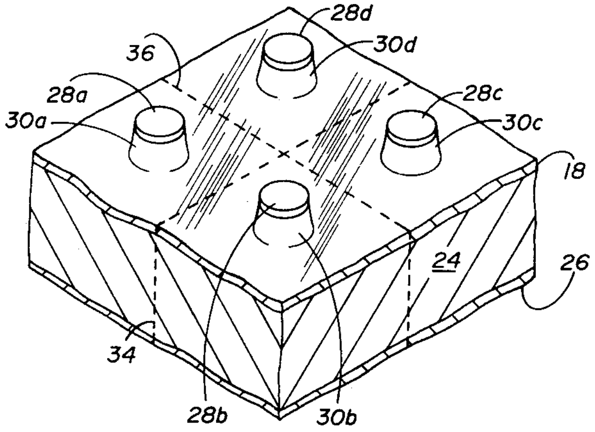
FIG. 7 illustrates a perspective view of the structure shown in FIG. 6 after four avalanche diodes mesas have been etched thereon.

Referring to FIG. 7, the next fabrication step comprises etching away portions of the semiconductor layers 12, 14 and 16 between the metal contacts 28*a–d* to form semiconductor mesas 30*a–d*. The etching away of the semiconductor layers is accomplished by standard photolithographic and etching techniques well-known in the art. Again, while only a portion of the semiconductor slice is shown in FIG. 7, in the practical embodiment one hundred to several thousand semiconductor mesas will be formed and will extend from the metallization layer 18.

Figure 8:
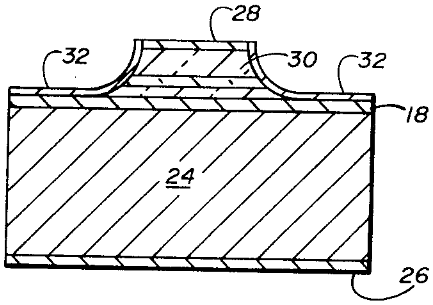
FIG. 8 is a sectional view of one of the avalanche diodes shown in FIG. 7 with a passivation layer added.

FIG. 8 illustrates a sectional view of one of the diode mesas shown in FIG. 7. It will be understood that each mesa comprises an individual avalanche diode. The final diode configuration will thus comprise an upper contact 28 and a three-layer semiconductor mesa 30 which extends outwardly from the metallization layer 18. The high conductivity metal layer 24 is thus thermally bonded to the avalanche diode and serves as a heat sink therefor. The metallization layer 26 enables the heat sink 24 to be easily bonded to a suitable package. In some instances, it will be desirable to passivate the exposed surfaces of semiconductor material by adding a passivation layer 32 according to conventional techniques. For instance, the passivation layer 32 may comprise silicon diode or an organic material such as resin or the like. Such passivation has in the past been found difficult with previously developed avalanche diode configurations.

Referring again to FIG. 7, if individual avalanche diodes are desired, the semiconductor wafer 10 is separated or divided along dotted lines 34 and 36 to provide four independent avalanche diodes connected to individual heat sink members. Such separation may be accomplished by sawing or etching procedures. A typical single avalanche diode formed in this manner would for instance have a diameter of about 6 mils, with the combined diode and heat sink being approximately 10 to 15 mils in thickness. The heat sink would typically be approximately 20 mils square. For such a configuration, the heat generated by the avalanche diode spreads into the high conductivity metal, with the bonding metallization layer 18 providing extremely low thermal impedance. The heat flow is nearly evenly distributed across the base of the heat sink and it is thus very easy to remove the heat therefrom. For the configuration just described, the heat flow density out of the base of the heat sink member would only be about 14 percent of the heat flow density of the avalanche diode itself. Thus, the heat sink of the invention could be easily alloyed into a package or circuitry with the alloyed bond to the metallization layer 26 being noncritical.

Figure 9:
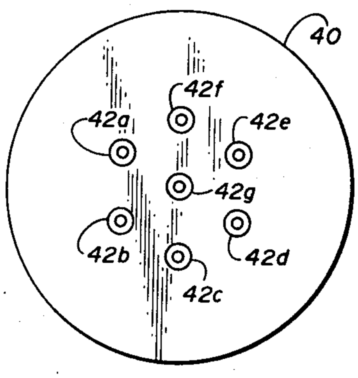
FIG. 9 illustrates a top view of one embodiment of an avalanche diode array according to the invention.
Figure 10:
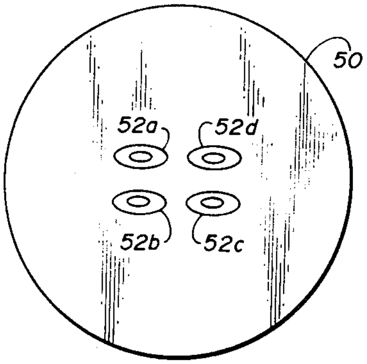
FIG. 10 illustrates a top view of another embodiment of an avalanche diode array according to the invention.

In many instances, it will be desirable to construct avalanche diode arrays as illustrated in FIGS. 9 and 10. Referring to FIG. 9, a heat sink member 40 may typically have a diameter of approximately 40 mils, with seven avalanche diodes 42*a–g* being formed thereon in the manner previously described. Typically, the diodes 42*a–g* would have a diameter of approximately 4 to 6 mils, and are spaced apart by 6 to 10 mils. One advantage of the formation of such an avalanche diode array according to the invention is that each of the diodes 42*a–g* have closely similar thermal resistances. This characteristic is extremely difficult to obtain with prior art techniques wherein individual diodes were separately fabricated. Due to the similar thermal characteristics provided by the present invention, the diodes 42*a–g* are capable of being easily paralleled to provide an equivalent large area diode with superior thermal resistance characteristics.

Referring to FIG. 10, a diode array may be formed according to the previously described technique which comprises a heat sink 50 supporting a plurality of avalanche diodes 52*a–d*. As may be seen in FIG. 10, the contact portions of the diodes 52*a–d* are elongated in shape to provide improved thermal resistance characteristics. Other shapes of the metal contacts according to the invention may also be utilized, such as a circular shape with the center portion removed.

The present invention thus provides a technique for fabricating semiconductor devices having good and consistent thermal bonds to heat sink members. The present invention is a distinct improvement over many prior art techniques which required precise controls of the geometries of individual devices, due to the requirements that the devices must be etched from two opposed sides. The front and back sides in such cases had to be critically aligned, thus requiring complicated process steps and complex machinery. The present technique eliminates such problems of alignment by requiring that the devices be etched from only one side. Additionally, the present technique eliminates breakage problems because a relatively thick metal heat sink layer serves as a carrier during subsequent processing such as thinning of the semiconductor slices.

Semiconductor devices formed according to the present invention are generally thinner than devices made according to prior art techniques, wherein etching from opposed sides was required. The thinner semiconductor articles according to this invention have reduced parasitic resistance in the semiconductor material, as well as reduced parasitic capacitance due to elimination of silicon overhang. This elimination of semiconductor overhang means the present devices are more readily passivated in slice form, an advantage which is particularly important if an inorganic passivation is to be evaporated or otherwise deposited on the device.

As previously noted, the semiconductor devices formed by the present technique may be closely matched with respect to thermal resistances, and also with respect to breakdown voltages in the case of avalanche diodes. Additionally, lower cost of processing per slice is attributable to the present process.

As previously noted, the present process is applicable to fabrication of a number of semiconductor devices in addition to avalanche diodes. For instance, the present technique may be used to process Gunn oscillators. Power transistors could also be fabricated according to this technique with lower thermal resistances than heretofore possible, by etching the transistors extremely thin from the backside and then metallizing the transistors with copper plating to provide a heat sink member. Schottky barrier avalanche diodes may also be advantageously constructed according to this technique, as the bonded surface of the diode may be formed essentially strain-free and thus have a true Schottky breakdown characteristic.

Whereas the present invention has been described with respect to a specific embodiment thereof, it is to be understood that various changes and modifications will be suggested to one skilled in the art, and it is intended to encompass these changes and modifications as are encompassed by the appended claims.

What is claimed is:

1. The method of fabricating semiconductor devices comprising:

a. applying a layer of heat sink material to one surface of a semiconductor substrate, b. removing portions of said substrate to form an array of spaced apart discrete semiconductor devices which extend from said layer of heat sink material, and thereafter c. dividing said layer of heat sink material to form a plurality of separate semiconductor devices attached to respective heat sinks.

2. The method defined in claim 1 and further comprising:

mounting said semiconductor substrate with an adhesive upon a support and applying said layer of heat sink material by a plating operation.

3. The method of claim 1 and further comprising:

reducing the thickness of said layer of heat sink material to a predetermined thickness, and applying a layer of contact metallization to said heat sink material to facilitate the subsequent bonding thereof.

4. The method of claim 1 and further comprising:

applying a layer of contact metallization between said layer of heat sink material and said one surface of said semiconductor substrate.

5. The method of claim 1 and further comprising:

machining said semiconductor substrate to a predetermined thickness, and applying a layer of contact metallization before removing portions of said substrate to form an array of discrete semiconductor devices.

6. The method of claim 1 wherein said step of removing portions comprises:

applying layers of photoresist material according to a predetermined mask, and etching away portions of said substrate in dependence upon said mask to form an array of discrete semiconductor devices extending from said layer of heat sink material.

7. The method of claim 1 and further comprising:

applying a layer of passivating material to portions of said array of discrete semiconductor devices extending from said layer of heat sink material.

8. The method of fabricating semiconductor devices comprising:

a. applying a contact layer over one surface of a semiconductor body having a P-N junction, b. forming a layer of high conductivity heat sink material over said contact layer, said layer of heat sink material being of a predetermined thickness to provide selected heat dissipation for said P-N junction, c. forming a plurality of discrete spaced apart contacts over a surface of said semiconductor body opposite said layer of heat sink material, and d. removing portions of said semiconductor body between said spaced apart contacts to form an array of discrete active semiconductor devices extending from said heat sink material and terminating in said contacts, and thereafter e. dividing said layer of heat sink material to form a plurality of separate semiconductor devices attached to respective heat sinks.

9. The method of claim 8 further comprising:

separating portions of said heat sink material to form a plurality of separate heat sinked semiconductor devices.

10. The method of claim 8 wherein said array of discrete active semiconductor devices comprise avalanche diodes.

11. The method of claim 8 wherein said contact layer applied over one surface of the semiconductor body comprises a multimetal layer to provide good ohmic contact with said layer of heat sink material.

12. The method of claim 8 wherein said layer of heat sink material is applied over said contact layer by electroplating.

13. The method of claim 8 wherein said discrete spaced apart contacts are formed over surface of said semiconductor body by applying a uniform layer of contact metal and etching away undesired portions of said contact metal.

14. The method of claim 8 wherein said portions of said semiconductor body are removed by etching away undesired portions defined by a mask.

15. The method of claim 8 and further comprising:
reducing the thickness of said layer of heat sink material down to said predetermined thickness and applying a layer of contact metallization to enable bonding of said heat sink material to a support.

16. The method of fabricating avalanche diodes with attached heat sinks comprising:

a. forming a semiconductor slice having a P-N junction,
b. applying a layer of contact metallization over the surface of said slice nearest said P-N junction,
c. applying a layer of high conductivity metal over said contact metallization of a sufficient thickness to provide heat dissipation for said P-N junction,
d. forming a plurality of spaced apart metal contacts over the surface of said slice opposite said layer of high conductivity metal,
c. removing portions of said semiconductor slice between said metal contacts to form an array of discrete avalanche diodes extending from said layer of high conductivity metal, and
f. dividing said layer of high conductivity metal to provide a plurality of avalanche diodes attached to individual heat sink members.

17. The method of claim 16 wherein said layer of contact metallization applied over the surface of said slice comprises a multimetal layer.

18. The method of claim 16 wherein said layer of high conductivity metal is applied by electroplating techniques.

19. The method of claim 16 and further comprising:
applying a layer of contact metallization to a surface of said high conductivity metal layer to facilitate bonding to a support member.

20. The method of claim 16 wherein said layer of high conductivity metal is divided to provide an array of avalanche diodes having closely similar thermal resistances upon a single supporting heat sink member.

21. The method of claim 16 and further comprising:
applying a layer of passivating material to said discrete avalanche diodes before the dividing of said layer of high conductivity metal.

* * * * *